United States Patent
Kitazawa

(10) Patent No.: US 11,264,961 B2
(45) Date of Patent: Mar. 1, 2022

(54) SEMICONDUCTOR CIRCUITRY

(71) Applicant: KIOXIA CORPORATION, Minato-ku (JP)

(72) Inventor: Naoki Kitazawa, Yokohama (JP)

(73) Assignee: KIOXIA CORPORATION, Minato-ku (JP)

( * ) Notice: Subject to any disclaimer, the term of this patent is extended or adjusted under 35 U.S.C. 154(b) by 131 days.

(21) Appl. No.: 16/569,306

(22) Filed: Sep. 12, 2019

(65) Prior Publication Data
US 2020/0295721 A1    Sep. 17, 2020

(30) Foreign Application Priority Data
Mar. 15, 2019    (JP) .............................. JP2019-049083

(51) Int. Cl.
H03F 3/45    (2006.01)
H04L 25/02   (2006.01)

(52) U.S. Cl.
CPC ..... H03F 3/45192 (2013.01); H03F 3/45291 (2013.01); H04L 25/0272 (2013.01); H04L 25/0282 (2013.01); H04L 25/0294 (2013.01); H03F 2203/45028 (2013.01)

(58) Field of Classification Search
CPC ..... H03F 3/45; H03F 3/45192; H03F 3/45291
USPC ................................................. 330/2, 9, 254
See application file for complete search history.

(56) References Cited

U.S. PATENT DOCUMENTS

| 8,004,353 B2 * | 8/2011 | Oelmaier ............ H03F 3/45179 330/9 |
| 8,026,761 B2 * | 9/2011 | Nolan ....................... H03F 1/30 330/9 |
| 8,606,193 B2 | 12/2013 | Ko et al. |
| 8,699,548 B2 | 4/2014 | Savo et al. |

FOREIGN PATENT DOCUMENTS

| JP | 2006-303786 A | 11/2006 |
| JP | 2008-109654 A | 5/2008 |
| JP | 4620717 B2 | 1/2011 |
| JP | 2012-509033 A | 4/2012 |
| JP | 2014-502464 A | 1/2014 |
| JP | 5579732 B2 | 8/2014 |
| JP | 5678203 B2 | 2/2015 |

* cited by examiner

Primary Examiner — Steven J Mottola
(74) Attorney, Agent, or Firm — Oblon, McClelland, Maier & Neustadt, L.L.P.

(57) ABSTRACT

A semiconductor circuitry includes a first circuitry having a differential transistor pair and a pair of current sources connected in series to the differential transistor pair, a pair of transmission lines connected to the differential transistor pair at the opposite side to the current sources, and a second circuitry, connected to a node between the differential transistor pair and the current sources, and configured to test operations of at least the differential transistor pair and a latter-stage circuitry connected to the transmission lines, in the state where the current outputs of the pair of current sources are stopped.

16 Claims, 10 Drawing Sheets

SEMICONDUCTOR CIRCUITRY

CROSS REFERENCE TO RELATED APPLICATIONS

This application is based upon and claims the benefit of priority from the prior Japanese Patent Application No. 2019-49083, filed on Mar. 15, 2019, the entire contents of which are incorporated herein by reference.

FIELD

Embodiments of the present disclosure relate to a semiconductor circuitry.

BACKGROUND

With improvement in processor processing performance and also in memory access speed, a wired communication circuitry capable of transmitting signals at high speed has been put into practical use.

In a case of wired transmission of signals of a Gigahertz band, parasitic capacitance of transmission lines affects a signal transmission speed. Therefore, it is required to make the parasitic capacitance as smaller as possible.

Moreover, in a case of mass production of this type of high-speed wired communication circuitry in a chip, there is a case in which a test circuitry for detecting a failure of each circuit element in the wired communication circuitry is implemented in each chip. In this case, there is a problem in that, if the test circuitry is connected to the transmission lines, the parasitic capacitance of the transmission lines increases and thus the signal transmission speed decreases.

Furthermore, in a case of providing the test circuitry in the wired communication circuitry, it is desired to detect failures of as many circuit elements in the wired communication circuitry as possible. However, in order for that, it is required to be connected the test circuitry to a location where signal transmission of the wired communication circuitry is not adversely affected.

DETAILED DESCRIPTION

According to the present embodiment, there is provided a semiconductor circuitry including a first circuitry having a differential transistor pair and a pair of current sources connected in series to the differential transistor pair, a pair of transmission lines connected to the differential transistor pair at the opposite side to the current sources, and a second circuitry, connected to a node between the differential transistor pair and the current sources, and configured to test operations of at least the differential transistor pair and a latter-stage circuitry connected to the transmission lines, in the state where the current outputs of the pair of current sources are stopped.

Hereinafter, embodiments will be explained with reference to the accompanying drawings. In the present embodiment and the accompanying drawings, for easy understanding and simplicity in drawings, the explanation and drawings are made with omitting, modifying or simplifying part of the configuration. However, the technical contents to the extent that a similar function can be expected will be interpreted to be included in the embodiments.

Figure 1:
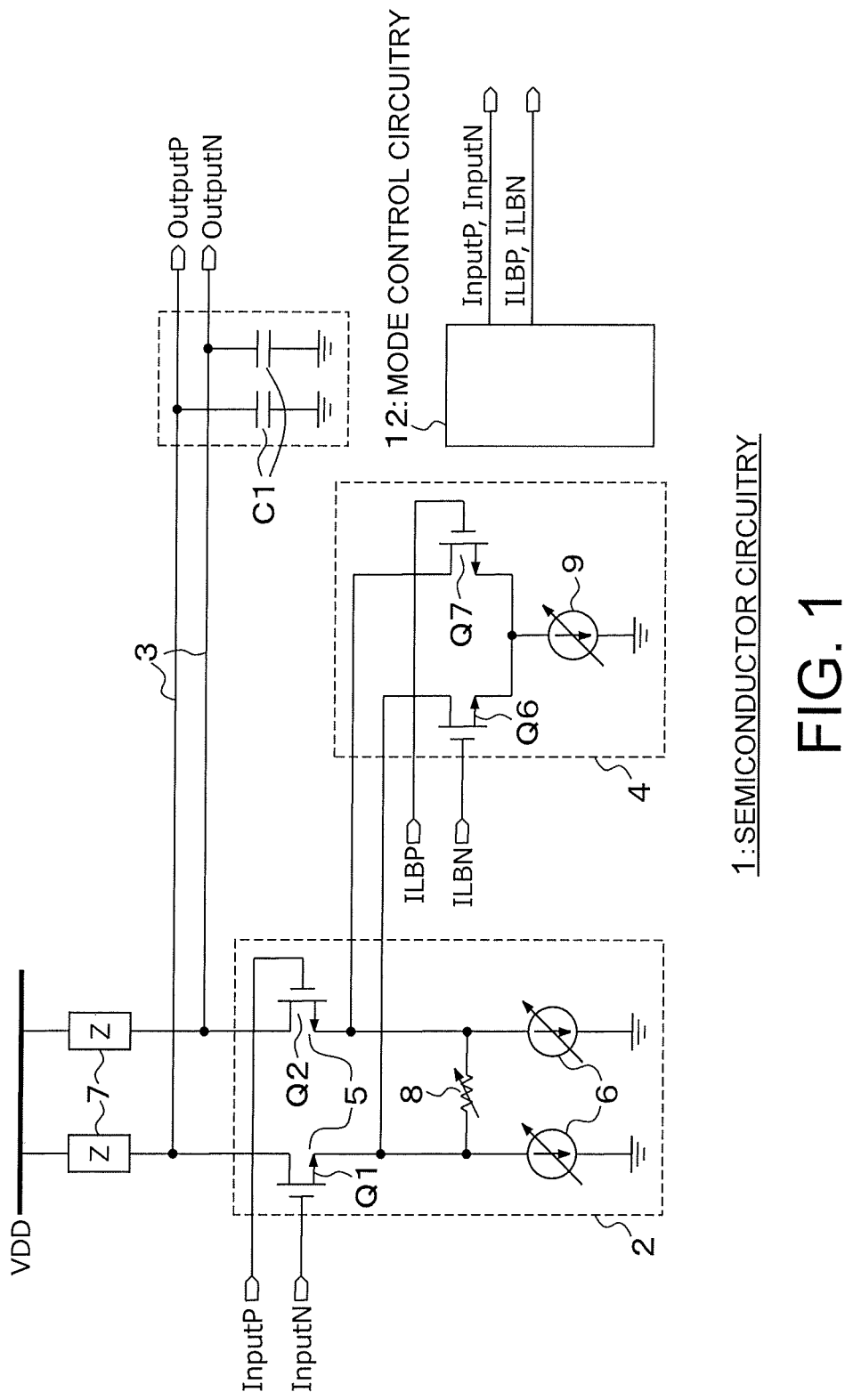
FIG. 1 is a circuit diagram of a semiconductor circuitry according to one embodiment.
Figure 2:
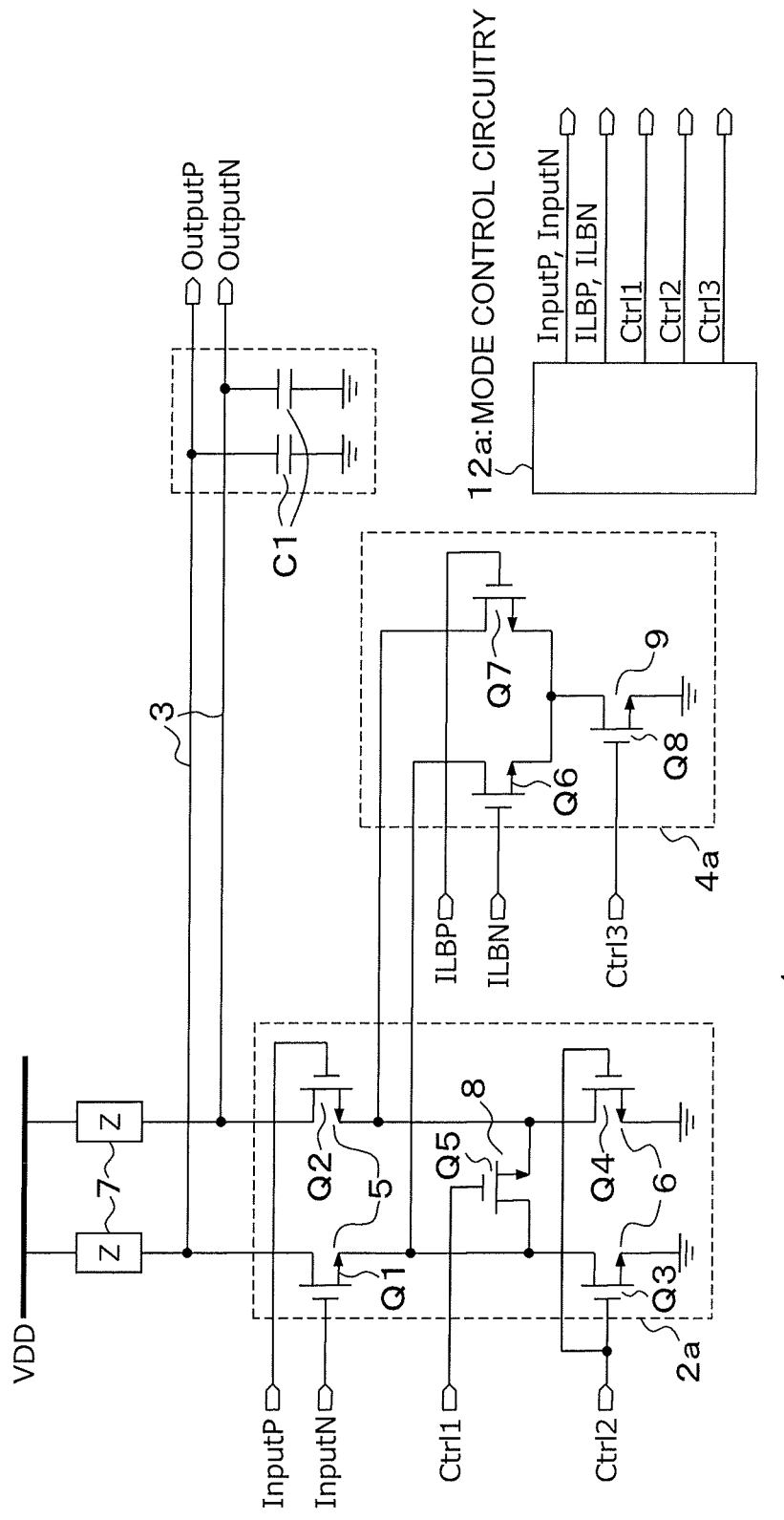
FIG. 2 is a circuit diagram of a more specific semiconductor circuitry of the semiconductor circuitry of FIG. 1.

FIG. 1 is a circuit diagram of a semiconductor circuitry 1 according to one embodiment. FIG. 2 is a more specific circuit diagram of a semiconductor circuitry 1a of the semiconductor circuitry 1 of FIG. 1. Circuit elements in each of the semiconductor circuitries 1 and 1a of FIGS. 1 and 2, respectively, are formed on the same semiconductor substrate and built in a chip. In the chip, circuitries other than the semiconductor circuitry 1 of FIG. 1 may be further provided.

The semiconductor circuitry 1 of FIG. 1 comprises an analog circuitry (first circuitry) 2, a pair of output transmission lines 3, and a test circuitry (second circuitry) 4. Examples of specific circuit configurations of the analog circuitry 2 and the test circuitry 4 will be described hereinafter. However, any of the circuit configurations are not limited to those examples.

The analog circuitry 2 can take various forms of circuit configurations. However, the analog circuitry 2 includes, at least, a differential transistor pair 5, a pair of current sources 6 connected to sources or emitters of the differential transistor pair 5, and a variable resistor 8 that can make resistance value between the sources or emitters of the differential transistor pair 5 almost infinite. In other words, the analog circuitry 2 includes the differential transistor pair 5 and the pair of current sources 6 connected in series to the differential transistor pair 5.

FIG. 1 shows a pair of NMOS transistors Q1 and Q2 as an example of the differential transistor pair 5. However, as described later, a pair of PMOS transistors may be used as the differential transistor pair 5. Moreover, a pair of Bi-CMOS transistors, a pair of bipolar transistors, etc. may be used as the differential transistor pair 5. Hereinafter, an example in which the pair of NMOS transistors Q1 and Q2 is used as the differential transistor pair 5 will mainly be explained.

To gates of the differential transistor pair 5, an input signal pair InputP and InputN are input. The differential transistor pair 5 supply signals obtained by amplifying the input signal pair InputP and InputN to the output transmission lines 3. The input signal pair InputP and InputN may be high-speed signals exceeding 1 GHz. It is also supposed in the present embodiment that a high-speed input signal pair InputP and InputN of about 16 GHz are input to the gates of the differential transistor pair 5. It is also a matter of course that a low-speed input signal pair InputP and InputN of 1 GHz or lower can be used.

The pair of current sources 6 are connected between the sources of the pair of NMOS transistors Q1 and Q2, and a reference potential node (for example, a ground node).

The pair of current sources 6 can be configured with NMOS transistors Q3 and Q4, as shown in an analog circuitry 2a provided in the semiconductor circuitry 1a of FIG. 2. A control voltage Ctrl2 is input to gates of the NMOS transistors Q3 and Q4. By controlling the control voltage Ctrl2 input to the gates of the NMOS transistors Q3 and Q4 that configure the pair of current sources 6, currents output from the pair of current sources 6 can be controlled. Moreover, by turning off the NMOS transistors Q3 and Q4, the currents output from the pair of current sources 6 can be stopped.

The specific circuit configuration of the pair of current sources 6 is not limited to that shown in FIG. 2. A plurality of transistors, resistors, etc. may be used to configure the current sources.

In the semiconductor circuitry 1 of FIG. 1, a pair of resistors 7 are connected between drains of the pair of NMOS transistors Q1 and Q2 that configure the differential transistor pair 5 and a power supply node VDD.

A pair of output transmission lines (transmission lines) 3 are connected to the drains of the pair of NMOS transistors Q1 and Q2. In other words, the pair of output transmission lines 3 are connected to the differential transistor pair 5 at the opposite side to the current sources 6. The pair of output transmission lines 3 are connected to a latter-stage circuitry not shown. What circuit operation the latter-stage circuitry performs is a matter of choice. The latter-stage circuitry connected to the output transmission lines 3 may also be built in the chip in which the semiconductor circuitry 1 of FIG. 1 is built. Or the latter-stage circuitry may be provided outside the chip. To the pair of output transmission lines 3, parasitic capacitance C1 is added which is caused by the analog circuitry 2, the output transmission lines 3, and the latter-stage circuitry. The semiconductor circuitry 1 of FIG. 1 may, for example, be a circuitry that configures a part of a receiver of a wired communication circuitry, or may be used for another usage.

The variable resistor 8 is connected between the sources of the pair of NMOS transistors Q1 and Q2 that configure the differential transistor pair 5. By controlling resistance value of the variable resistor 8, a gain at which the differential transistor pair 5 amplify the input signal pair InputP and InputN can be adjusted. If it is not required to perform gain adjustment, the variable resistor 8 may be replaced with a resistor that has a function of switching between a fixed value and an infinite value.

As shown in an analog circuitry 2a provided to a semiconductor circuitry 1a of FIG. 2, the variable resistor 8 can, for example, be configured with an NMOS transistor Q5. A control voltage Ctrl1 is input to a gate of the NMOS transistor Q5. By adjusting a gate voltage of the NMOS transistor Q5 with the control voltage Ctrl1, a drain-to-source resistance of the NMOS transistor Q5 can be varied to make the NMOS transistor Q5 function as the variable resistor 8. A specific circuit configuration of the variable resistor 8 is not limited to that shown in FIG. 2.

The test circuitry 4 of FIG. 1 is connected to the sources or emitters of the differential transistor pair 5. In the semiconductor circuitry 1 of FIG. 1, the test circuitry 4 is connected to the sources of the pair of NMOS transistors Q1 and Q2 that configure the differential transistor pair 5. Drains of a pair of NMOS transistors Q6 and Q7 in the test circuitry 4 of FIG. 1 are connected to the sources of the differential transistor pair 5 in the analog circuitry 2. A current source 9 is connected between sources of the pair of NMOS transistors Q6 and Q7 in the test circuitry 4 and a reference potential node (for example, a ground node). In a test mode (first mode), the semiconductor circuitry 1 of FIG. 1 stops the current outputs of the pair of the current sources 6 in the analog circuitry 2 and sets the resistance value of the variable resistor 8 to be almost infinite, and, in that state, tests whether or not there is a failure in the differential transistor pair 5 and the latter-stage circuitry connected to the output transmission lines 3, using the test circuitry 4. Accordingly, the test circuitry 4 can test whether or not there is a failure, not only in the latter-stage circuitry, but also in the differential transistor pair 5. The test circuitry 4 is connected to nodes between the differential transistor pair 5 and the pair of current sources 6, and can test the operations of the differential transistor pair 5 and the latter-stage circuity connected to the output transmission lines 3 in the state where the current output of the pair of current sources 6 is stopped.

The test circuitry 4 has at least one transistor of the same conductive type as a conductive type of the differential transistor pair 5. FIG. 1 shows an example in which the test circuitry 4 has the pair of NMOS transistors Q6 and Q7, and the current source 9. As shown in a test circuitry 4a of FIG. 2, the current source 9 can be configured, for example, with an NMOS transistor Q8. In FIGS. 1 and 2, a signal pair (test pattern pair) ILBP and ILBN are input to gates of the NMOS transistors Q6 and Q7, and further in FIG. 2, a control voltage Ctrl3 is input to a gate of the NMOS transistor Q8. In the present embodiment, ILBP and ILBN in a regular (or normal) operation mode (second mode) are referred to as a signal pair, and ILBP and ILBN in the test mode are referred to as a test pattern pair.

As described above, it is one feature of the semiconductor circuitries 1 and 1a according to the present embodiment that the drains of the pair of NMOS transistors Q6 and Q7 in the test circuitries 4 and 4a, respectively, are connected to the sources of the differential transistor pair 5, however, the test circuitries 4 and 4a each are not connected to the output transmission lines 3.

Figure 3:
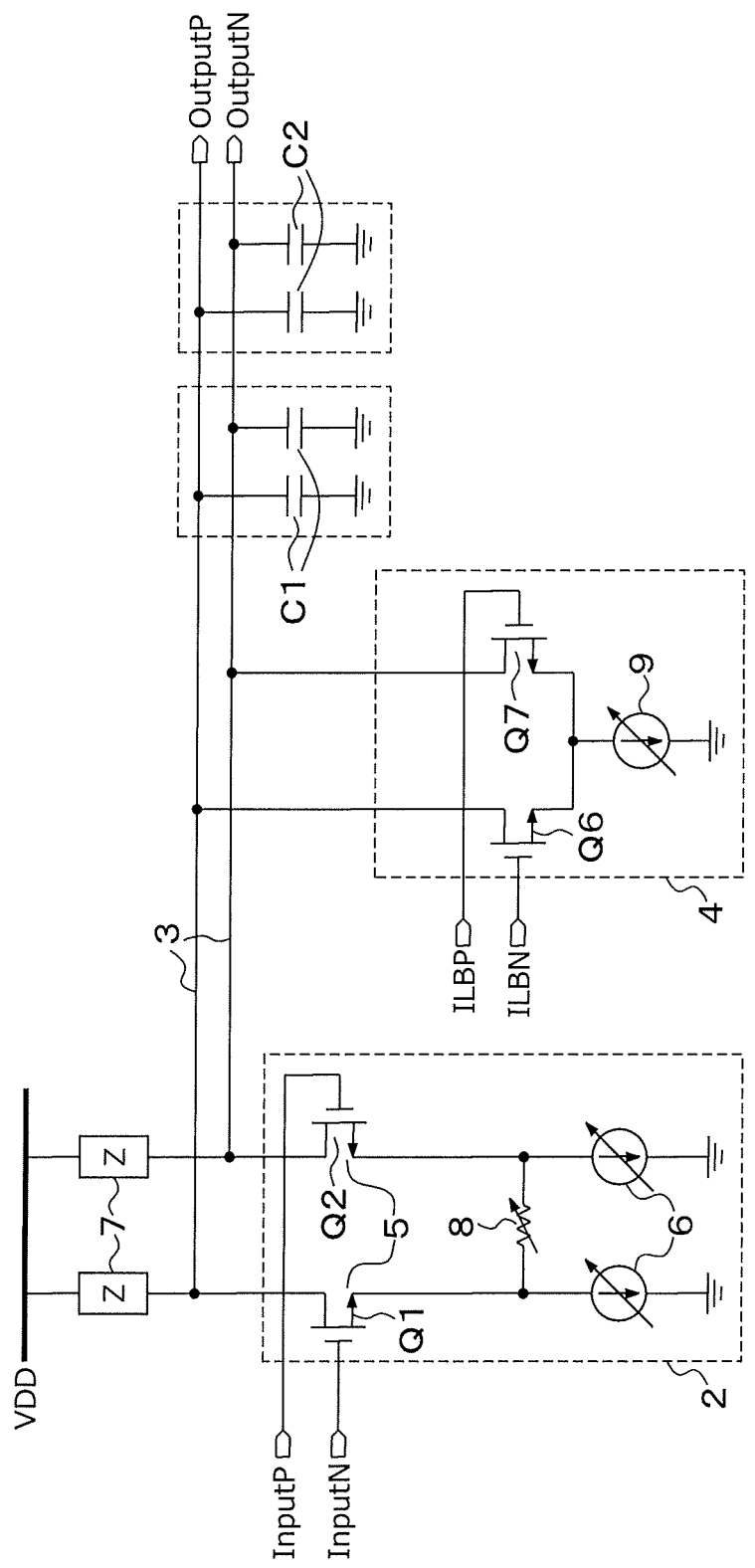
FIG. 3 is a circuit diagram of a semiconductor circuitry according to one comparative example.

FIG. 3 is a circuit diagram of a semiconductor circuitry 11 according to one comparative example. In the semiconductor circuitry 11 of FIG. 3, the drains of a pair of NMOS transistors Q6 and Q7 in a test circuitry 4 are connected to a pair of output transmission lines 3. As shown in FIG. 3, when the test circuitry 4 is connected to the pair of output transmission lines 3, the parasitic capacitance of the pair of output transmission lines 3 increases, so that the signal transmission speed of the semiconductor circuitry 11 may decrease. In FIG. 3, parasitic capacitance C2 of the output transmission lines 3 increased by the test circuitry 4 is shown separately from parasitic capacitance C1 caused by an analog circuitry 2. In the present embodiment, as shown in FIG. 1, the test circuitry 4 is connected, not to the output transmission lines 3, but to the sources of the differential transistor pair 5, so that there is no possibility of increase in parasitic capacitance of the output transmission lines 3 and also no possibility of decrease in signal transmission speed of the analog circuitry 2.

The analog circuitry 2 and the test circuitry 4 of FIG. 1 switch their operations using signals from a mode control circuitry (third circuitry) 12. The mode control circuitry 12 of FIG. 1 controls the signals InputP and InputN to be input to the gates of the differential transistor pair 5 in the analog circuitry 2 and the signal pair (test pattern pair) ILBP and ILBN to be input to the gates of the pair of NMOS transistors Q6 and Q7 in the test circuitry 4. A mode control circuitry 12a of FIG. 2 controls the signal Ctrl1 that controls the variable resistor 8, the signal Ctrl2 that controls the current sources 6, and the signal Ctrl3 that controls the current source 9, in addition to those controls signals of the mode control circuitry 12 of FIG. 1.

The mode control circuitries 12 and 12a each input the input signal pair InputP and InputN to the gates of the differential transistor pair 5 in the analog circuitries 2 and 2a, respectively, in the regular operation mode. The mode control circuitry 12 of FIG. 1 sets the variable resistor 8 at a particular resistance value and the currents output from the current sources 6 to a particular value, and turns off the pair of NMOS transistors Q6 and Q7 in the test circuitry 4 using the signals ILBP and ILBN. The mode control circuitry 12a of FIG. 2 sets the variable resistor 8 at a particular resistance value using the signal Ctrl1 input to the gate of the transistor Q5 that configures the variable resistor 8 and the currents output from the current sources 6 to a particular value using the signal Ctrl2 input to the NMOS transistors Q3 and Q4 that configure the current sources 6, and turns off the pair of NMOS transistors Q6 and Q7 in the test circuitry 4a using the signals ILBP and ILBN input to the gates of the pair of NMOS transistors Q6 and Q7. In this way, the test circuitries 4 and 4a each are cut off in the regular operation mode, so that an output signal pair obtained by amplifying the input signal pair InputP and InputN at a gain in accordance with the resistance value of the variable resistor 8 in the analog circuitries 2 and 2a, respectively, are supplied to the output transmission lines 3.

In the test mode, the mode control circuitries 12 and 12a each fix the gates of the differential transistor pair 5 in the analog circuitries 2 and 2a, respectively, at a particular voltage, using the input signal pair InputP and InputN. The mode control circuitry 12 of FIG. 1 sets the resistance value of the variable resistor 8 to be infinite, stops the currents output from the current sources 6, and sets the current output from the current source 9 in the test circuitry 4 to a particular value, and, in that state, inputs the test pattern pair ILBP and ILBN to the gates of the pair of NMOS transistors Q6 and Q7. The mode control circuitry 12a of FIG. 2 sets the resistance value of the variable resistor 8 to be infinite using the signal Ctrl1 input to the gate of the transistor Q5 that configures the variable resistor 8 and turns off the transistors Q3 and Q4 that configure the current sources 6 using the signal Ctrl2 input to the gates of the transistors Q3 and Q4 to stop the currents output from the current sources 6. Moreover, the mode control circuitry 12a of FIG. 2 sets the current output from the current source 9 to a particular value using the signal Ctrl3 input to the gate of the transistor Q8 that configures the current source 9, and, in that state, inputs the test pattern pair ILBP and ILBN to the gates of the pair of NMOS transistors Q6 and Q7. Setting the resistance value of the variable resistor 8 to be infinite is equivalent to the nonexistence of the variable resistor 8. Accordingly, in the test mode, a test signal pair output from each of the test circuitries 4 and 4a are supplied to the output transmission lines 3 via the differential transistor pair 5.

The mode control circuitry 12 can be configured with a resister circuitry and the like in the semiconductor circuitry 1 of FIG. 1.

Figure 4:
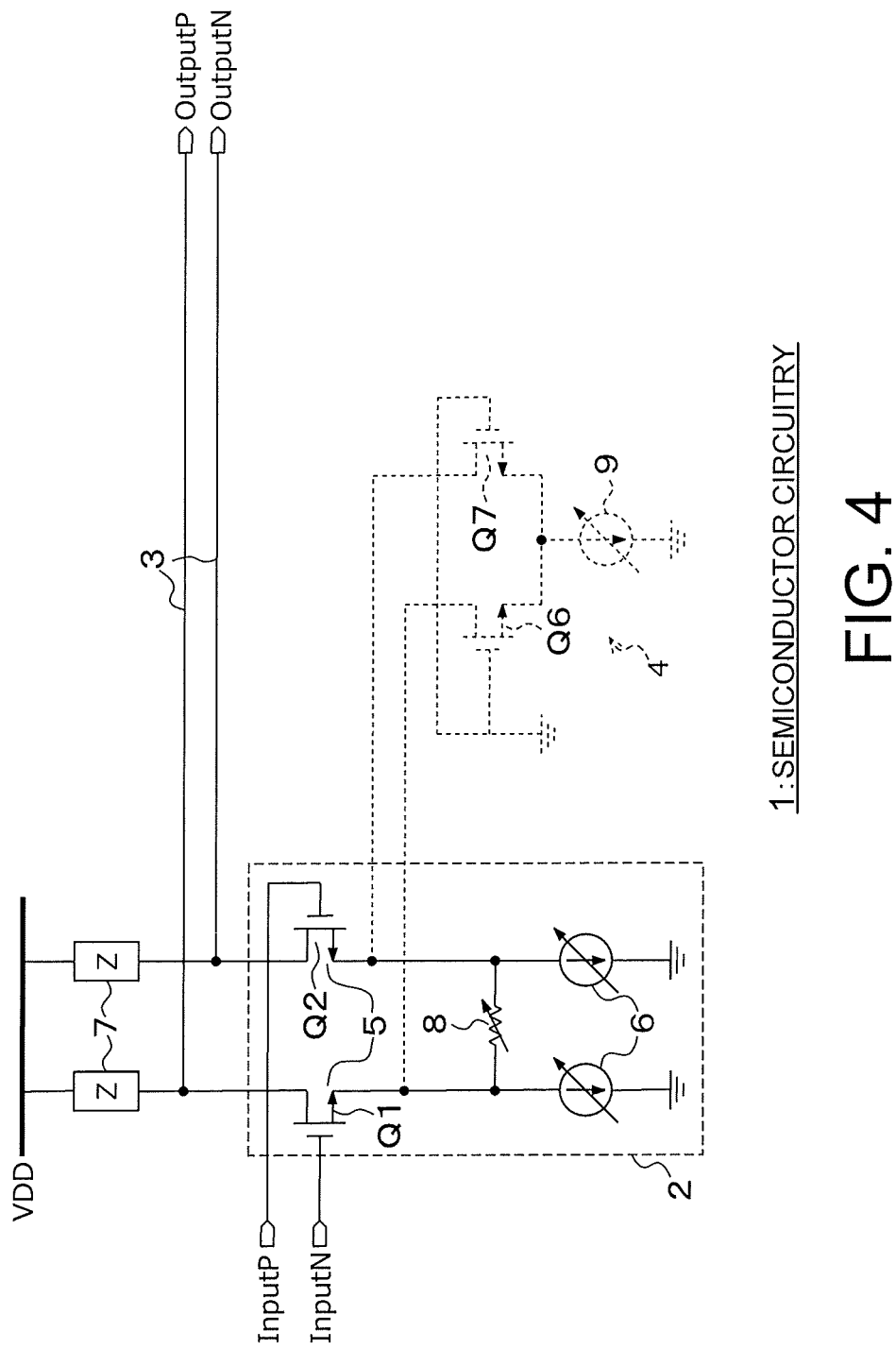
FIG. 4 is an equivalent circuit diagram in a regular operation mode of the semiconductor circuitry of FIG. 1.

FIG. 4 is an equivalent circuit diagram in the regular operation mode of the semiconductor circuitry 1 of FIG. 1. As shown, in the regular operation mode, since the pair of NMOS transistors in the test circuitry 4 are turned off, the test circuitry 4 is cut off from the differential transistor pair 5. The output signal pair, obtained by amplifying the input signal pair InputP and InputN input to the gates of the differential transistor pair 5 at a gain in accordance with the resistance value of the variable resistor 8, are supplied to the pair of output transmission lines 3.

Figure 5:
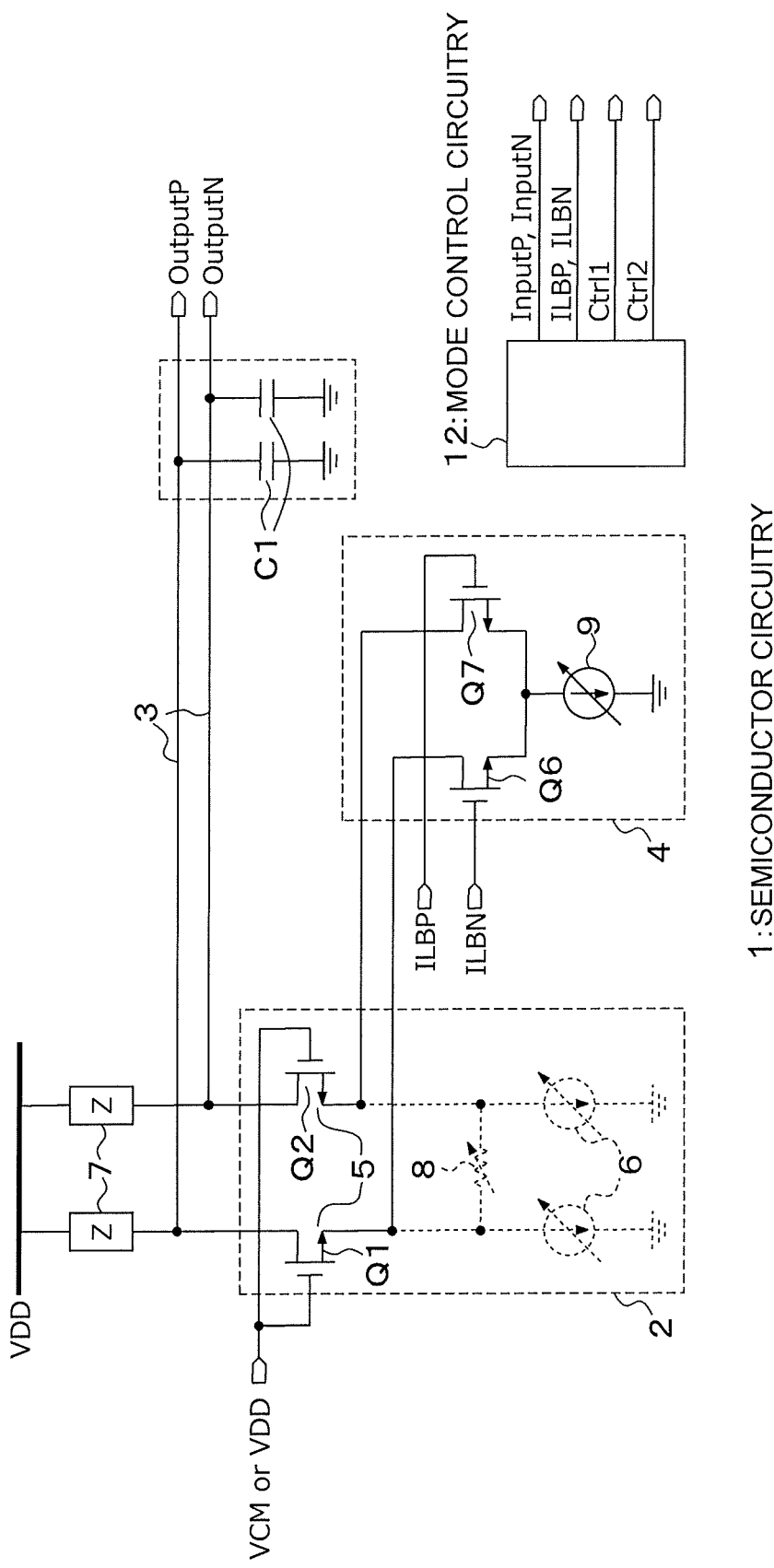
FIG. 5 is an equivalent circuit diagram in a test mode of the semiconductor circuitry of FIG. 1.

FIG. 5 is an equivalent circuit diagram in the test mode of the semiconductor circuitry 1 of FIG. 1. As shown, in the test mode, the gates of the differential transistor pair 5 in the analog circuitry 2 are set at a common mode voltage VCM or a power supply voltage VDD. Moreover, the variable resistor 8 and the current sources 6 in the analog circuitry 2 are cut off whereas the drains of the pair of NMOS transistors Q6 and Q7 in the test circuitry 4 are connected to the sources of the differential transistor pair 5 in the analog circuitry 2. Accordingly, a test signal pair in accordance with the test pattern pair ILBP and ILBN input to the gates of the pair of NMOS transistors Q6 and Q7 in the test circuitry 4 are supplied, passing through the differential transistor pair 5, to the pair of output transmission lines 3.

Figure 6:
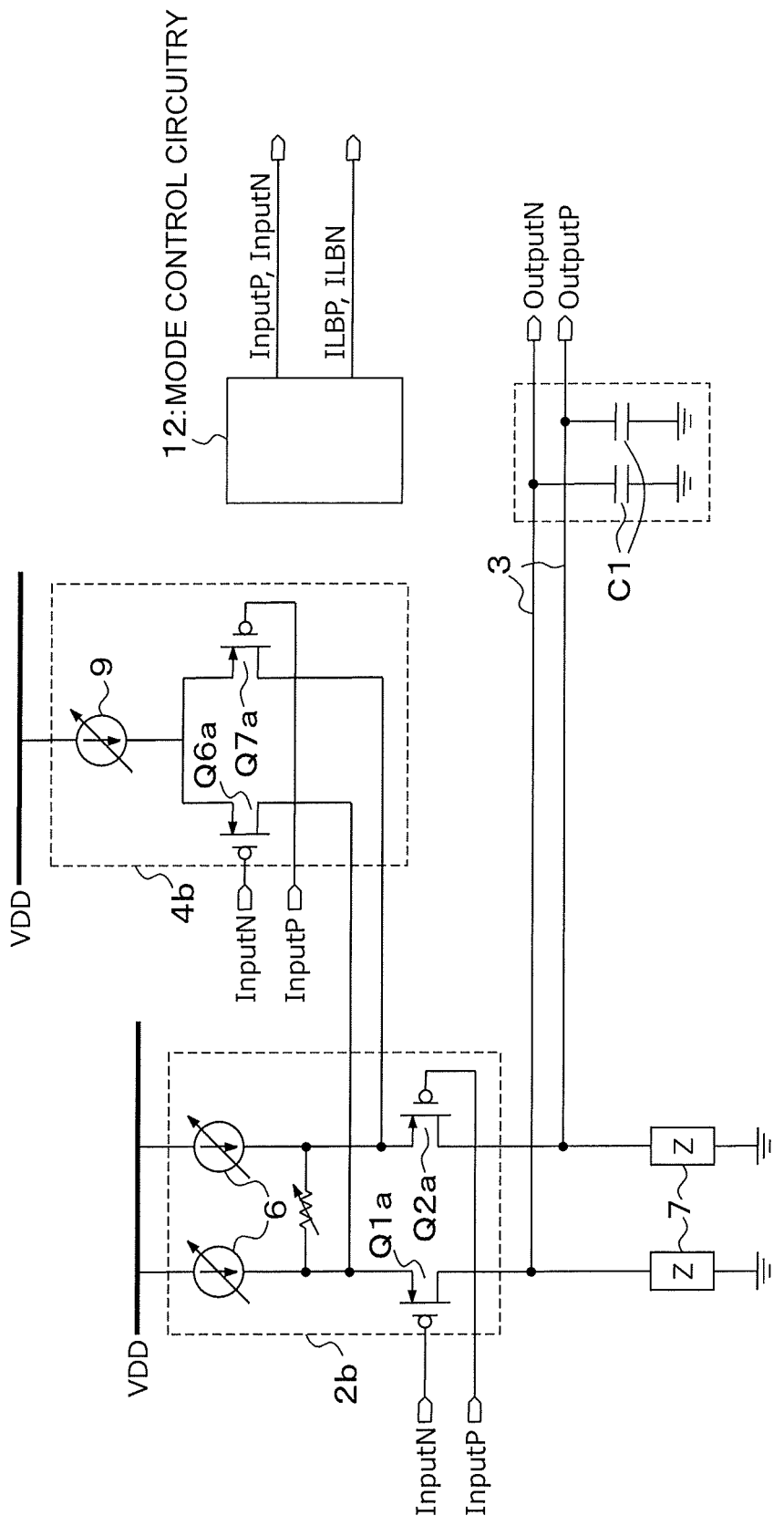
FIG. 6 is a circuit diagram of a semiconductor circuitry configured with PMOS transistors.

The semiconductor circuitry 1 of FIG. 1 is an example in which the transistors in the analog circuitry 2 and the test circuitry 4 are configured with NMOS transistors. However, as shown in FIG. 6, those transistors may be configured with PMOS transistors. In a semiconductor circuitry 1b of FIG. 6, the connection relationship among the circuit elements is the reverse of that in FIG. 1, between the power supply node VDD and the ground node. Also in the semiconductor circuitry 1b of FIG. 6, the drains of a pair of PMOS transistors Q6a and Q7a in a test circuitry 4b are connected to sources of a pair of PMOS transistors Q1a and Q2a, respectively, in an analog circuitry 2b, however, the test circuitry 4b is not connected to the output transmission lines 3.

As described above, in the semiconductor circuitries 1, 1a and 1b according to the first embodiment, the test circuitries 4, 4a and 4b are connected, not to the output transmission lines 3, but to the sources of differential transistor pair 5 in the analog circuitries 2, 2a and 2b, respectively. Therefore, even though the test circuitries 4, 4a and 4b are each connected as described above, there is no possibility of increase in parasitic capacitance of the output transmission lines 3. Moreover, in the test mode, the test signal pair in accordance with the test pattern pair ILBP and ILBN are supplied, passing through the differential transistor pair 5 in each of the analog circuitries 2, 2a and 2b, to the output transmission lines 3. Therefore, not only the detection of failure in the latter-stage circuit of the output transmission lines 3, but also the detection of failure in the differential transistor pair 5 can be performed.

Second Embodiment

Figure 7:
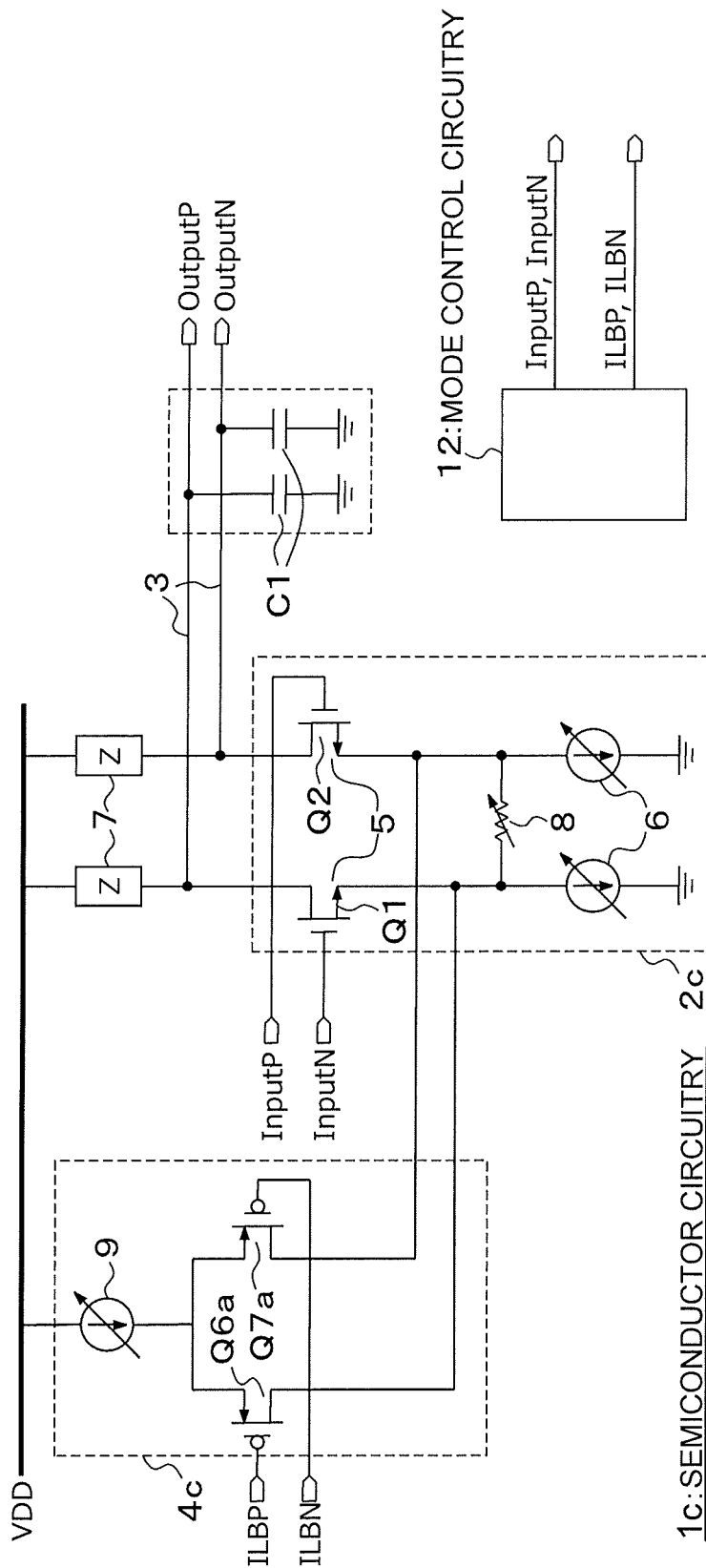
FIG. 7 is a circuit diagram of a semiconductor circuitry according to a second embodiment.

FIG. 7 is a circuit diagram of a semiconductor circuitry 1c according to a second embodiment. The semiconductor circuitry 1c of FIG. 7 is different from the semiconductor circuitry 1 of FIG. 1 in that a test circuitry 4c has at least one transistor of a different conductive type from the conductive type of a differential transistor pair 5 in an analog circuitry 2c.

In more specifically, the test circuitry 4c in the semiconductor circuitry 1c of FIG. 7 has a pair of PMOS transistors Q6a and Q7a, and a current source 9. Drains of the pair of the PMOS transistors Q6a and Q7a are connected to the sources of the differential transistor pair 5 in the analog circuitry 2c. The current source 9 is connected between sources of the pair of PMOS transistors Q6a and Q7a, and a power supply node VDD.

As described above, in the semiconductor circuitry 1c of FIG. 7, the differential transistor pair 5 in the analog circuitry 2c and the pair of PMOS transistors Q6a and Q7a in the test circuitry 4c are configured in a folded cascode configuration. By configuring those transistors in the folded cascode configuration, the operation voltage margin of the test circuitry 4c can be widened. Therefore, the voltage level margin of a test pattern pair ILBP and ILBN to be input to gates of the pair of the PMOS transistors Q6a and Q7a in the test circuitry 4c can be widened, so that the operation in the test mode can further be stabilized.

The semiconductor circuitry 1c of FIG. 7 is an example in which the differential transistor pair 5 in the analog circuitry 2c are configured with NMOS transistors Q1 and Q2 whereas the test circuitry 4c is provided with the pair of PMOS transistors Q6a and Q7a. However, by reversing the connection relationship among the circuit elements between the power supply node VDD and the ground node, the differential transistor pair 5 in the analog circuitry 2c may be configured with PMOS transistors whereas the test circuitry 4c may be provided with a pair of NMOS transistors.

As described above, the second embodiment has the folded cascode configuration in which the differential transistor pair 5 in the analog circuitry 2c and the pair of transistors in the test circuitry 4c are different in conductive type, so that the operation voltage margin of the test circuitry 4c can be widened, and hence the operation in the test mode can be stabilized.

Third Embodiment

A third embodiment utilizes the test circuitry 4 as the variable resistor 8 in the regular operation mode.

Figure 8:
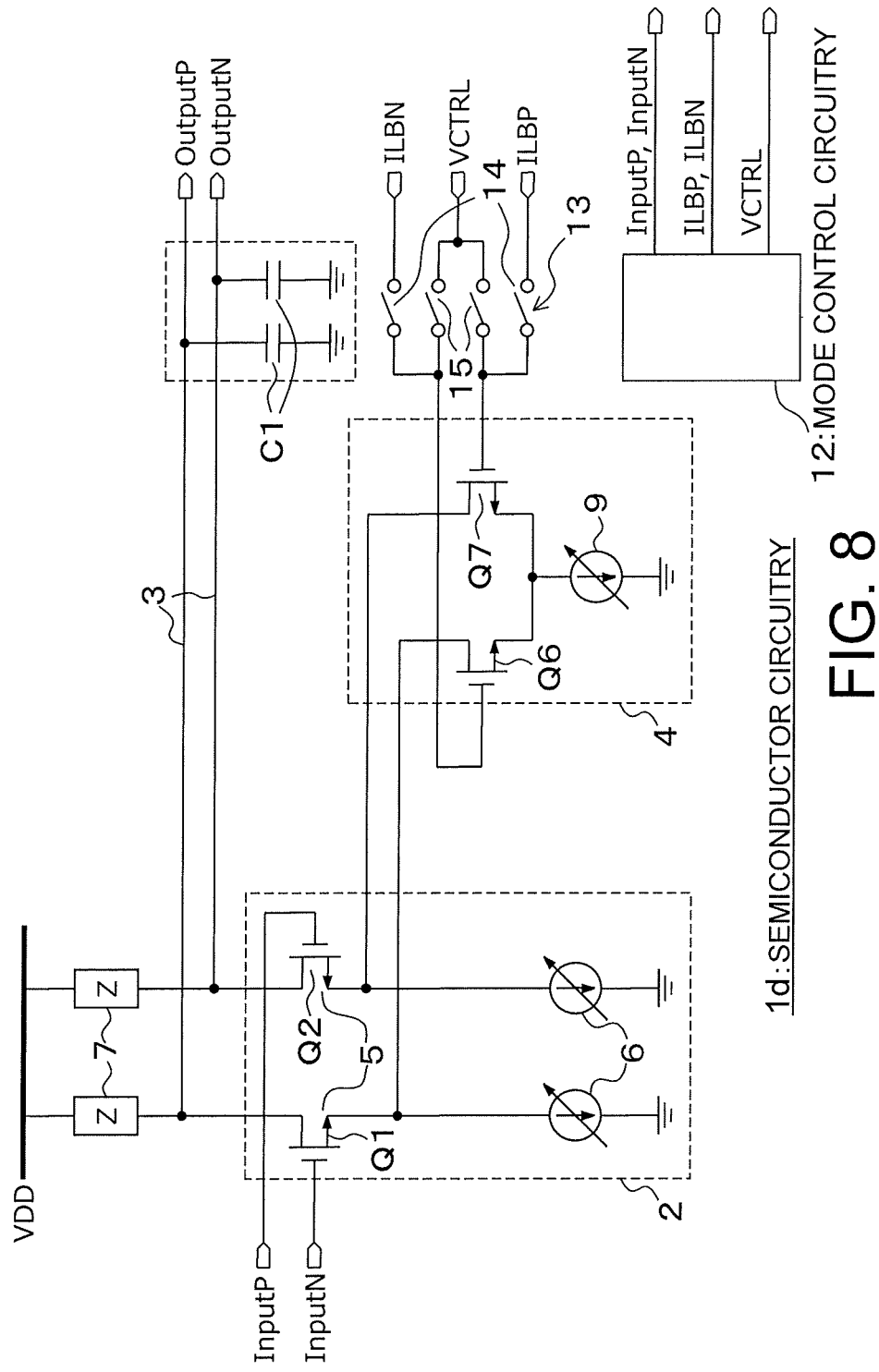
FIG. 8 is a circuit diagram of a semiconductor circuitry according to a third embodiment.

FIG. 8 is a circuit diagram of a semiconductor circuitry 1d according to the third embodiment. The semiconductor circuitry 1d of FIG. 8 is provided with a function switch 13 while omitting the variable resistor 8 shown in the semiconductor circuitry 1 of FIG. 1. The function switch 13 makes the test circuitry 4 operate as the variable resistor 8 connected between the source or emitter of one of the differential transistor pair 5 and the source or emitter of the other in the regular operation mode. On the other hand, in the test mode, the function switch 13 uses the test circuitry 4 for testing whether there is a failure in the differential transistor pair 5 and the latter-stage circuity connected to the output transmission lines 3. The function switch 13 has a first switch pair 14 and a second switch pair 15.

The first switch pair 14 select whether to input a test pattern pair to the gates of the pair of NMOS transistors Q6 and Q7 in the test circuitry 4. The first switch pair 14 are turned on in the test mode to input the test pattern pair to the gates of the pair of NMOS transistors Q6 and Q7. The first switch pair 14 are turned off in the regular operation mode.

The second switch pair 15 select whether to input a resistance control voltage VCTRL, which controls the resistance value of the variable resistor 8, to the gates of the pair of NMOS transistors Q6 and Q7 in the test circuitry 4, when the test circuitry 4 is used as the variable resistor 8. The second switch pair 15 are turned on in the regular operation mode to input the resistance control voltage VCTRL to the gates of the pair of NMOS transistors Q6 and Q7 in the test circuitry 4. The second switch pair 15 are turned off in the test mode.

Figure 9:
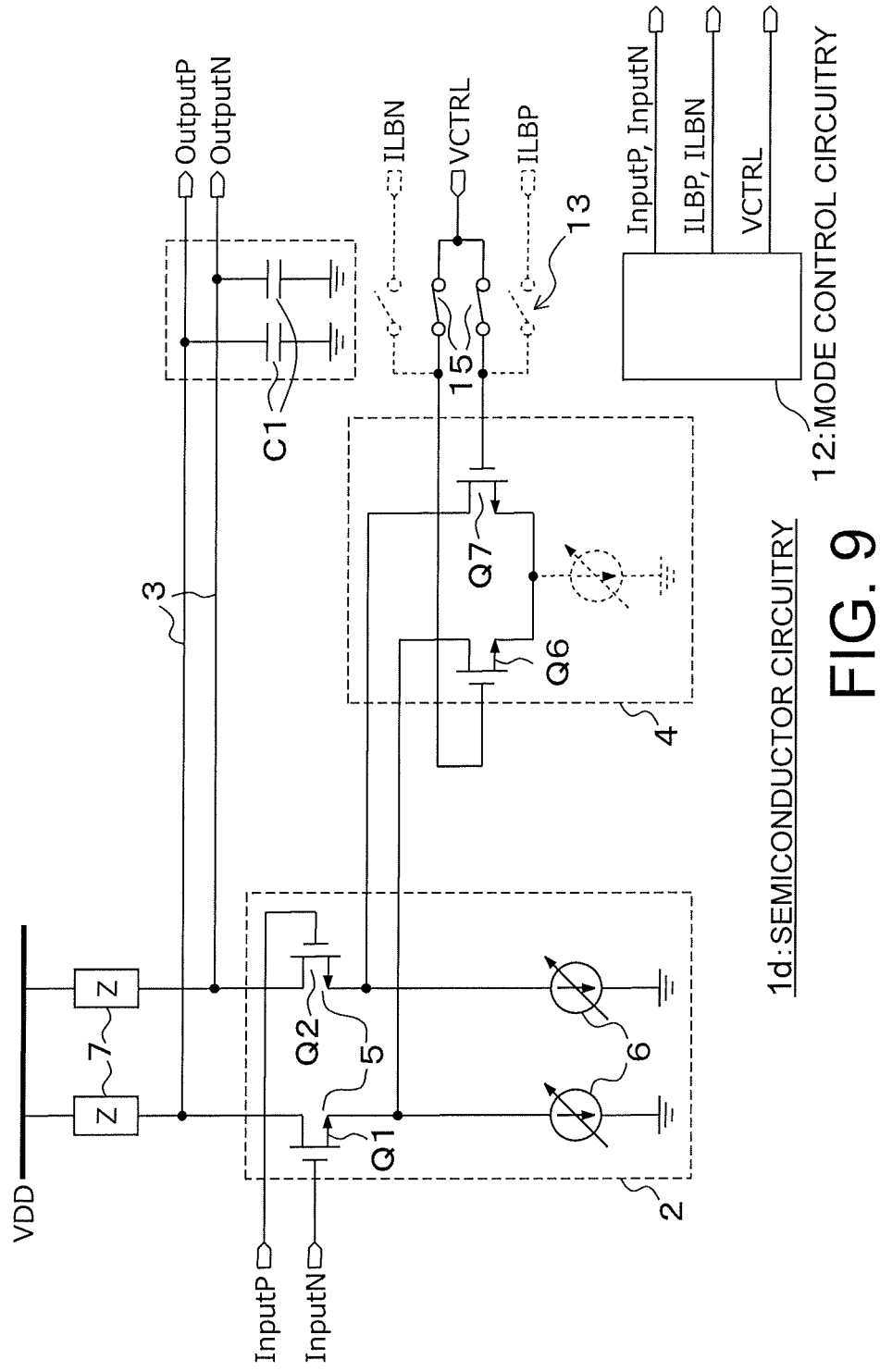
FIG. 9 is an equivalent circuit diagram in a regular operation mode of the semiconductor circuitry of FIG. 8.

FIG. 9 is an equivalent circuit diagram in the regular operation mode of the semiconductor circuitry 1d of FIG. 8. In the regular operation mode, the first switch pair 14 are turned off whereas the second switch pair 15 are turned on, so that the resistance control voltage VCTRL is input to the gates of the pair of NMOS transistors Q6 and Q7 in the test circuitry 4. According to the configuration described above, the pair of NMOS transistors Q6 and Q7 function as a variable resistor 8 having a resistance value in accordance with the resistance control voltage VCTRL.

Figure 10:
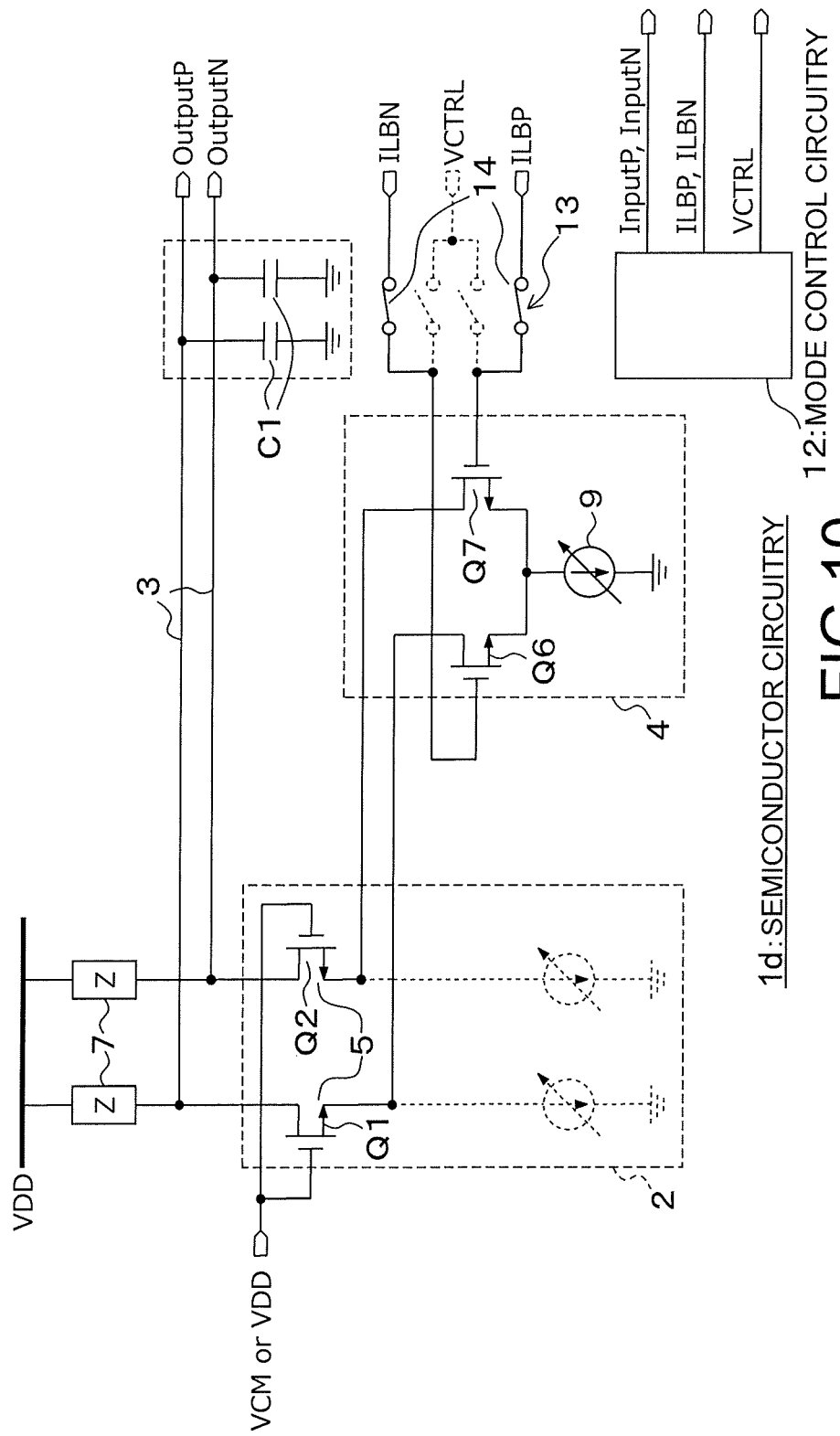
FIG. 10 is an equivalent circuit diagram in a test mode of the semiconductor circuitry of FIG. 8.

FIG. 10 is an equivalent circuit diagram in the test mode of the semiconductor circuitry 1d of FIG. 8. In the test mode, the second switch pair 15 are turned off whereas the first switch pair 14 are turned on, so that the test pattern pair ILBP and ILBN are input to the gates of the pair of NMOS transistors Q6 and Q7, respectively, in the test circuitry 4. According to the configuration described above, a test signal pair in accordance with the test pattern pair ILBP and ILBN propagate, passing through the differential transistor pair 5 in the analog circuitry 2, through the output transmission lines 3.

In FIG. 8, the transistors in the semiconductor circuitry 1d are configured with NMOS transistors. However, in the same manner as in FIG. 6, by reversing the connection relationship among the circuit elements between the power supply node VDD and the ground node, the transistors in the semiconductor circuitry 1d may be configured with PMOS transistors.

As described above, the third embodiment is provided with the function switch 13 to the test circuitry 4, in place of the variable resistor 8, the function of the function switch 13 being switched between the regular operation mode and the test mode. Specifically, the function switch 13 utilizes the pair of NMOS transistors Q6 and Q7 in the test circuitry 4 as the variable resistor 8 in the regular operation mode. Therefore, it is not required to provide the variable resistor 8 other than the test circuitry 4, so that the circuit configuration can be simplified.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor circuitry comprising:
   a first circuitry comprising a differential transistor pair and a pair of current sources connected in series to the differential transistor pair;
   a pair of transmission lines connected to the differential transistor pair at an opposite side to the current sources; and
   a second circuitry, connected to a node between the differential transistor pair and the current sources, and configured to test operations of at least the differential transistor pair and a latter-stage circuitry connected to the transmission lines, in a state where current outputs of the pair of current sources are stopped,
   wherein the second circuitry comprises at least one transistor of a different conductive type from a conductive type of the differential transistor pair.

2. The semiconductor circuitry of claim 1, wherein the second circuitry comprises a pair of transistors of a different conductive type from a conductive type of the differential transistor pair; and
   wherein the differential transistor pair in the first circuitry and the pair of transistors in the second circuitry are configured in a folded cascade configuration.

3. The semiconductor circuitry of claim 1, wherein the second circuitry comprises:

a first transistor and a second transistor connected in parallel to the current sources, respectively; and a current source connected to sources or emitters of the first and second transistors, wherein, to gates or bases of the first and second transistors, a test pattern pair are input in a first mode, and a signal to turn off the first and second transistors is input in a second mode.

4. The semiconductor circuitry of claim 1 further comprising a third circuitry configured to, in a first mode, control gates or bases of the differential transistor pair to be fixed at a particular voltage, stop the current outputs of the pair of current sources, and supply a test signal pair output from the second circuitry to the transmission lines via the differential transistor pair.

5. The semiconductor circuitry of claim 4, wherein, in a second mode, the third circuitry is configured to stop output of the test signal pair from the second circuitry, make the pair of current sources output currents, and input an input signal pair to the gates or bases of the differential transistor pair.

6. The semiconductor circuitry of claim 1 further comprising a resistor connected between a source or emitter of one of the differential transistor pair and a source or emitter of another of the differential transistor pair, wherein, in a first mode, a resistance value of the resistor is set to be infinite and, in a second mode, the resistance value is variable.

7. The semiconductor circuitry of claim 1 further comprising a function switch configured to use the second circuitry, in a first mode, to test the operations of the differential transistor pair and the latter-stage circuitry connected to the transmission lines, and use the second circuitry, in a second mode, as a variable resistor connected between a source or emitter of one of the differential transistor pair and a source or emitter of another of the differential transistor pair.

8. The semiconductor circuitry of claim 7, wherein the function switch is configured to select whether to input a test signal or a resistance control voltage to a gate or base of the transistor of the second circuitry, the resistance control voltage varying a resistance value between a drain or collector of the transistor of the second circuitry and a source or emitter of the transistor of the second circuitry.

9. The semiconductor circuitry of claim 8, wherein the second circuitry further comprises:

a first transistor and a second transistor connected to sources or emitters, respectively, of the differential transistor pair; and a current source connected to sources or emitters of the first and second transistors, wherein, in the first mode, the function switch is configured to input a test signal pair to gates or bases of the first and second transistors, and in the second mode, input the resistance control voltage to the gates or bases of the first and second transistors.

10. A semiconductor circuitry comprising:

a first circuitry including a differential transistor pair and a pair of current sources connected to sources or emitters, respectively, of the differential transistor pair;

a pair of transmission lines connected to drains or correctors, respectively, of the differential transistor pair; and a second circuitry, connected to the sources or emitters of the differential transistor pair, and configured to test operations of at least the differential transistor pair and a latter-stage circuitry connected to the transmission lines, in a state where current outputs of the pair of current sources are stopped, wherein the second circuitry comprises at least one transistor of a different conductive type from a conductive type of the differential transistor pair.

11. The semiconductor circuitry of claim 10, wherein the second circuitry comprises a pair of transistors of a different conductive type from a conductive type of the differential transistor pair; and wherein the differential transistor pair in the first circuitry and the pair of transistors in the second circuitry are configured in a folded cascode configuration.

12. The semiconductor circuitry of claim 10, wherein the second circuitry comprises:

a first transistor and a second transistor connected to the sources or emitters, respectively, of the differential transistor pair; and a current source connected to sources or emitters of the first and second transistors, wherein, to gates or bases of the first and second transistors, a test pattern pair are input in a first mode, and a signal to turn off the first and second transistors is input in a second mode.

13. The semiconductor circuitry of claim 10 further comprising a third circuitry configured to, in a first mode, control gates or bases of the differential transistor pair to be fixed at a particular voltage, stop the current outputs of the pair of current sources, and supply a test signal pair output from the second circuitry to the transmission lines via the differential transistor pair, and in a second mode, stop output of the test signal pair from the second circuitry, make the pair of current sources output currents, and input an input signal pair to the gates or bases of the differential transistor pair.

14. The semiconductor circuitry of claim 10 further comprising a resistor connected between the source or emitter of one of the differential transistor pair and the source or emitter of another of the differential transistor pair, wherein, in a first mode, a resistance value of the resistor is set to be infinite and, in a second mode, the resistance value is variable.

15. The semiconductor circuitry of claim 10 further comprising a function switch configured to use the second circuitry, in a first mode, to test the operations of the differential transistor pair and the latter-stage circuitry connected to the transmission lines, and use the second circuitry, in a second mode, as a variable resistor connected between the source or emitter of one of the differential transistor pair and the source or emitter of another of the differential transistor pair.

16. The semiconductor circuitry of claim 15, wherein the function switch is configured to select whether to input a test signal or a resistance control voltage to a gate or base of the transistor of the second circuitry, the resistance control voltage varying a resistance value between a drain or collector of the transistor of the second circuitry and a source or emitter of the transistor of the second circuitry.

* * * * *